(12) United States Patent
Onozawa et al.

(10) Patent No.: US 6,919,641 B2
(45) Date of Patent: Jul. 19, 2005

(54) SEMICONDUCTOR DEVICE AND METHOD FOR FABRICATING THE SAME

(75) Inventors: Kazutoshi Onozawa, Osaka (JP); Tetsuzo Ueda, Osaka (JP); Daisuke Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/462,744

(22) Filed: Jun. 17, 2003

(65) Prior Publication Data

US 2004/0056268 A1 Mar. 25, 2004

(30) Foreign Application Priority Data

Sep. 25, 2002  (JP) ........................................ 2002-279690

(51) Int. Cl.[7] .............................................. H01L 23/52
(52) U.S. Cl. ...................... 257/777; 257/724; 257/686; 257/685; 257/723
(58) Field of Search ................................ 257/686, 685, 257/777, 723, 680, 778, 673, 737, 738, 698, 724, 679, 99, 618, 619; 438/107, 455, 597

(56) References Cited

U.S. PATENT DOCUMENTS 4,293,826 A  * 10/1981  Scifres et al. ................. 372/44
5,545,291 A     8/1996  Smith et al. ................. 438/107
5,783,856 A     7/1998  Smith et al. ................. 257/618
5,824,186 A  * 10/1998  Smith et al. ................. 438/597
5,904,545 A     5/1999  Smith et al. ................. 438/455
6,547,451 B1 *  4/2003  Nishikawa et al. ........... 385/88
6,653,157 B2 * 11/2003  Kondo ......................... 438/22
6,707,141 B2 *  3/2004  Akram ....................... 257/686

FOREIGN PATENT DOCUMENTS

| JP | 11-144307 | 5/1999 | |
| JP | 11144307 A * | 5/1999 | ............ G11B/7/14 |
| JP | 11-149652 | 6/1999 | |
| JP | 11-186651 | 7/1999 | |

* cited by examiner

Primary Examiner—Nathan J. Flynn
Assistant Examiner—Scott R. Wilson
(74) Attorney, Agent, or Firm—McDermott Will & Emery LLP

(57) ABSTRACT

A semiconductor device includes: a substrate having in its principal surface first and second recessed portions formed adjacent to each other; and first and second semiconductor laser chips each having a portion that is inserted in one of the recessed portions. The depth of the recessed portions is smaller than the height of the first and second semiconductor laser chips that are disposed in the recessed portions.

20 Claims, 12 Drawing Sheets

SEMICONDUCTOR DEVICE AND METHOD FOR FABRICATING THE SAME

BACKGROUND OF THE INVENTION

The present invention relates to methods for fabricating semiconductor devices, and more particularly relates to semiconductor device fabrication methods which enable semiconductor light emitters, such as semiconductor laser devices, to be mounted in a self-aligned manner.

Typical digital-versatile-disc (hereinafter referred to as "DVD") players need to function to play back compact discs (hereinafter referred to as "CDs") in addition to DVDs, and also have to function to replay, and store data on, recordable CDs (CD-Rs) which have become widespread rapidly in recent years.

As a light for replaying DVDs, a red laser beam with a wavelength in the 650 nm band is employed, while an infrared laser beam with a wavelength in the 780 nm band is used as a light for playing back CDs and CD-R discs. In the currently available DVD players, therefore, two semiconductor laser diodes are incorporated in the form of an array: one is a red semiconductor laser diode for generating a red laser beam and the other is an infrared semiconductor laser diode for generating an infrared laser beam.

With an increasing demand for smaller personal computers and other information equipment, DVD players also need to be reduced further in size and thickness. To that end, it is indispensable to reduce the size and thickness of optical pickup. Methods for reducing optical pickup in size and thickness include optical system simplification.

As a method for simplifying an optical system, integration of a red semiconductor laser diode and an infrared semiconductor laser diode is available. The current DVD players include two optical systems: one for a red semiconductor laser diode and the other for an infrared semiconductor laser diode. Integration of the red semiconductor laser diode and the infrared semiconductor laser diode allows one optical system to be shared, thereby realizing an optical pickup system of smaller size and thickness.

For instance, as one example of the integration of a red semiconductor laser diode and an infrared semiconductor laser diode, a so-called monolithic semiconductor laser diode array which is integrated on a substrate is disclosed in Japanese Laid-Open Publication No. 11-186651.

Japanese Laid-Open Publication Nos. 11-144307 and 11-149652 disclose another example, in which hybrid integration of two semiconductor laser chips, one for a red laser and the other for an infrared laser, enables an optical system to be shared in an optical pickup system.

Nevertheless, in the conventional monolithic two-wavelength laser diode array, the respective active layers of the laser diodes have different compositions and thus have to be grown in different process steps, which results in the problem of low yields. In particular, when high-output laser diodes are monolithically integrated, yields decrease significantly.

Moreover, it is very difficult, in the viewpoint of crystal growth, to monolithically integrate a gallium nitride (GaN)-based blue laser diode, which is used in high density DVDs, and an aluminum gallium indium phosphide (AlGaInP)-based red laser diode, which is used in typical (conventional) DVDs.

The conventional hybrid optical pickup, on the other hand, have the problem that when the red semiconductor laser chip and the infrared semiconductor laser chip are assembled using assembly equipment, it is difficult to adjust and optimize the locations of the active layers of the semiconductor laser chips and the distance between the light emitting points thereof.

In recent years, mounting methods in which a fluidic self-assembly (hereinafter referred to as "FSA") technique is used have been developed as one type of device-mounting method.

In the FSA technology, devices (hereinafter referred to as "function blocks") ranging in size from 10 $\mu$m to several hundred $\mu$m and having given shapes are suspended into a liquid to form a slurry. The liquid (suspension) in the form of slurry is poured over the surface of a substrate of, e.g., silicon having recessed portions therein. The recessed portions are substantially the same as the function blocks in size and shape. In this manner, the function blocks that have been spread in the liquid are settled into the recessed portions and thereby mounted onto the substrate.

The FSA technology is disclosed in U.S. Pat. No. 5,545,291, U.S. Pat. No. 5,783,856, U.S. Pat. No. 5,824,186 and U.S. Pat. No. 5,904,545, for example.

However, the conventional FSA process has the problem that it is not easy to form in the substrate the recessed portions into which the function blocks are disposed, resulting in low productivity.

SUMMARY OF THE INVENTION

An object of the present invention is therefore that in the fabrication of a semiconductor device that is formed by hybrid integration of semiconductor chips, the semiconductor chips can be easily and reliably mounted using the FSA technology.

To achieve the object, in a semiconductor device according to the present invention, the depth of recessed portions, which are formed in a substrate and into which semiconductor chips are disposed, is such that only respective portions of the semiconductor chips are inserted in the recessed portions.

In addition, in a semiconductor device fabrication method according to the present invention, with a substrate being rotated in its principal surface in a fluid in which a plurality of semiconductor chips have been spread, the semiconductor chips are disposed into recessed portions.

Specifically, an inventive semiconductor device includes: a substrate having a plurality of recessed portions in its principal surface, and a plurality of semiconductor chips each disposed in one of the recessed portions with a portion thereof inserted in that recessed portion. The depth dimension of the recessed portions is smaller than the height of the semiconductor chips that are disposed in the recessed portions.

In the inventive semiconductor device, the depth dimension of the recessed portions formed in the substrate is smaller than the height of the semiconductor chips that are disposed in the recessed portions. Thus, it is not necessary to form the recessed portions to a depth at which the semiconductor chips are inserted into the recessed portions entirely. As a result, it becomes easier to form the recessed portions, which reliably increases productivity in the manufacturing of the semiconductor device.

In the inventive semiconductor device, the semiconductor chips are preferably facet-emitting semiconductor laser chips that emit a laser beam from a facet, and the recessed portions in the substrate are preferably formed so that the respective emission directions of the semiconductor laser chips are aligned in one direction.

Then, only by disposing the semiconductor laser chips into the recessed portions in the substrate, the locations of the respective active layers of the semiconductor laser chips self-align with each other, and the respective light-emitting points of the semiconductor laser chips also self-align with each other at a uniform distance. In addition, the semiconductor laser chips are capable of being integrated together, even if their constituents (compositions) differ from each other. Further, the recessed portions themselves function to align the emission directions of the semiconductor laser chips, such that wavefront aberration of a spot formed when the resultant semiconductor device is used in an optical pickup system can be reliably within an allowable range.

In the case where the semiconductor chips are the semiconductor laser chips, two of the semiconductor laser chips preferably have mutually different emission wavelengths.

Also, in this case, two of the semiconductor laser chips preferably have mutually different optical output values.

Further, in this case, a notch, through which a laser-emitting portion of an associated one of the semiconductor laser chips is exposed, is preferably formed in the substrate.

Then, even if the semiconductor device has a structure in which the laser-emitting position (laser-emitting point) of each facet-emitting semiconductor laser chip is embedded in the recessed portion, a laser beam can be reliably obtained through the notch.

In that case, at least two said notches are preferably formed.

Also, the notch preferably has the shape of a depression and the lower end of the notch preferably reaches the bottom face of an associated one of the recessed portions.

Furthermore, in the case where the semiconductor chips are the semiconductor laser chips, in each said semiconductor laser chip, optical output from a front facet is preferably equivalent in value to optical output from a rear facet.

Then, the emission direction for the semiconductor laser chips does not have to be selected, which further facilitates the manufacturing of the device.

In the inventive semiconductor device, the portion of each said semiconductor chip that is inserted in one of the recessed portions preferably differs in shape from the other portion thereof.

Then, when the portions of the semiconductor chips are inserted into the recessed portions, the upper and lower sides of the semiconductor chips are determined in a self-aligned manner.

In this case, each said semiconductor chip preferably has a projection on the side thereof on which the semiconductor chip is inserted in one of the recessed portions.

In the inventive semiconductor device, a recess electrode is preferably formed on the bottom face of each said recessed portion in the substrate. A chip electrode is preferably formed on a face of each said semiconductor chip which faces the bottom face of the associated one of the recessed portions, and each said semiconductor chip is preferably electrically connected to the associated recess electrode via the chip electrode.

Then, even if each semiconductor chip is structured to have a chip electrode on its face (bottom face) that faces the bottom face of the associated recessed portion, an operating current can be reliably supplied to the semiconductor chip by establishing electrical connection with the associated recess electrode from the substrate bottom, for example.

In this case, each said recess electrode is preferably formed so that an edge portion thereof extends beyond the principal surface of the substrate.

In that case, the recess electrode is preferably so formed as to be used in common by the semiconductor chips. Then, even if the semiconductor chips have mutually different operating characteristics, a chip electrode can be formed on the bottom faces of the semiconductor chips so as to be used in common.

In the inventive semiconductor device, the respective portions of the semiconductor chips which are inserted in the recessed portions preferably differ from each other in shape, and the shapes of the recessed portions preferably vary according to the associated semiconductor chips.

Then, the semiconductor chips can be selectively disposed into the recessed portions formed in the substrate.

In this case, the semiconductor chips are preferably light emitters, and the respective portions of the light emitters which are inserted in the recessed portions preferably vary in shape in accordance with the emission wavelengths of the light emitters. Then, if the light emitters are laser diodes, a two-wavelength laser chip array can be obtained.

Further, the semiconductor chips are preferably light emitters, and the respective portions of the light emitters which are inserted in the recessed portions preferably vary in shape in accordance with the optical output values of the light emitters. Then, if the light emitters are laser diodes, a laser chip array in which different functions, such as writing and reading, can be performed is obtainable.

An inventive method for fabricating a semiconductor device includes the steps of (a) forming a plurality of recessed portions in the principal surface of a substrate, and (b) spreading a plurality of semiconductor elements in the form of chips in a liquid and pouring the semiconductor-element-spread liquid over the principal surface of the substrate with the substrate being rotated in the principal surface thereof, thereby allowing the semiconductor elements to be disposed into the respective recessed portions in a self-aligned manner.

According to the inventive semiconductor device fabrication method, the semiconductor elements spread in the liquid are easily disposed into the recessed portions, which increases productivity in the manufacturing of the semiconductor device.

In the inventive method, in the step (a), the depth dimension of the recessed portions is preferably made smaller than the height of the semiconductor elements.

Then, it is not necessary to form the recessed portions to a depth at which the semiconductor elements are fitted into the recessed portions entirely. This facilitates the formation of the recessed portions in the substrate, which allows a further increase in the productivity in fabricating the semiconductor device. In addition, when the semiconductor elements are disposed into the recessed portions formed in the substrate in the step (b), only a portion of each semiconductor element is inserted into the recessed portion. Thus, the other portion of the already disposed semiconductor element that protrudes from the substrate surface would be in the way of the other semiconductor elements. However, in the inventive method, since the semiconductor-element-spread liquid is poured with the substrate being rotated, the position, in the substrate, of each such already disposed semiconductor element that would be in the way of the other semiconductor elements is changed with respect to the direction of the flowing fluid, such that the flow of the other semiconductor elements is not obstructed.

Accordingly, the semiconductor elements can be disposed into the recessed portions reliably.

In the inventive method, the semiconductor elements are preferably facet-emitting semiconductor laser chips that emit a laser beam from a facet, and in the step (a), the recessed portions are preferably formed so that the respective emission directions of the semiconductor laser chips are aligned in one direction.

Then, the locations of the respective active layers of the semiconductor laser chips self-align with each other, and the respective light-emitting points of the semiconductor laser chips also self-align with each other at a uniform distance. In addition, the semiconductor laser chips are capable of being integrated together, even if their constituents (compositions) differ from each other. Further, the recessed portions themselves function to align the emission directions of the semiconductor laser chips, such that wavefront aberration of a spot formed when the resultant semiconductor device is used in an optical pickup system can be reliably within an allowable range.

In the case where the semiconductor elements are the semiconductor laser chips, the step (a) preferably includes the step of forming in the substrate a notch through which a laser-emitting portion of an associated one of the semiconductor laser chips is exposed.

Then, even if each facet-emitting semiconductor laser chip is embedded in the recessed portion, a laser beam can be obtained through the notch.

In the inventive method, in the step (a), the recessed portions are preferably so formed as to vary in shape in accordance with the shapes of portions of the semiconductor elements which are inserted in the recessed portions.

Then, the semiconductor laser chips with mutually different emission wavelengths can be selectively disposed into the recessed portions formed in the substrate even by a FSA process, which allows a two-wavelength laser chip array, for example, to be obtained reliably.

In this case, the inventive method preferably further includes, before the step (b), the step of forming the respective portions of the semiconductor elements which are inserted in the recessed portions, in the shape of a projection.

BRIEF DESCRIPTION OF THE DRAWINGS

FIG. 1A is a plan view, FIG. 1B is a front view, and FIG. 1C is a left side view.

FIG. 3A is a plan view, FIG. 3B is a front view, and FIG. 3C is a front view illustrating semiconductor laser chips which form a chip array.

FIG. 6A is a plan view illustrating a semiconductor laser device according to a first modified example, FIG. 6B is a plan view illustrating a semiconductor laser device according to a second modified example, and FIG. 6C is a plan view illustrating a semiconductor laser device according to a third modified example.

FIG. 7A is a plan view, and FIG. 7B is a partial enlarged plan view of FIG. 7A.

DESCRIPTION OF THE PREFERRED EMBODIMENTS (First Embodiment)

Hereinafter, a first embodiment of the present invention will be described with reference to the accompanying drawings.

Figure 1A:
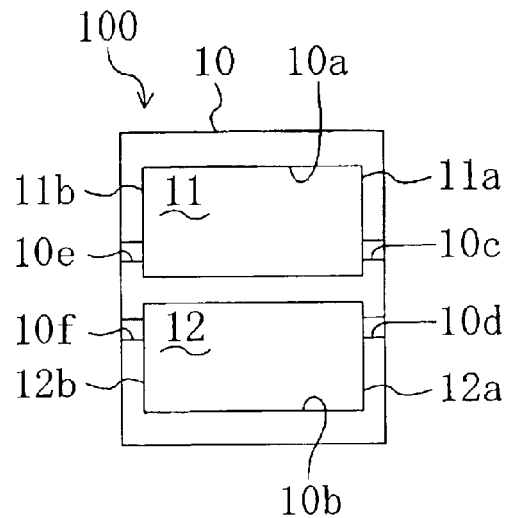
FIGS. 1A through 1C schematically illustrate a semiconductor laser device in accordance with a first embodiment of the present invention.
Figure 1B:
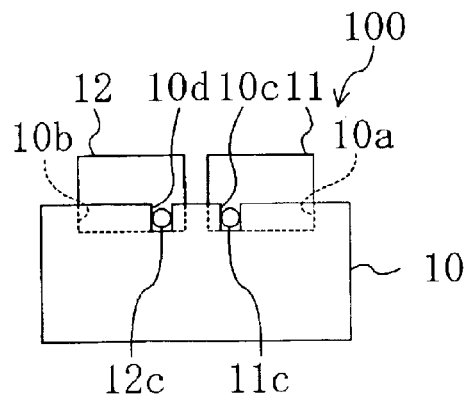
Figure 1C:
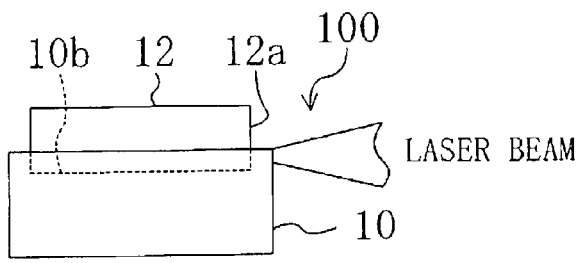

FIGS. 1A through 1C illustrate a semiconductor laser device in accordance with a first embodiment of the present invention. FIG. 1A shows a plan configuration, FIG. 1B shows a front configuration, and FIG. 1C shows a left-side configuration.

As shown in FIG. 1A, a semiconductor laser device 100 in accordance with the first embodiment includes a substrate 10, which is made of silicon (Si), for example, and which has first and second recessed portions 10a and 10b formed in the principal surface thereof. The first and second recessed portions 10a and 10b are spaced apart from each other and have the shape of a rectangle.

Inserted in the first recessed portion 10a is the lower portion of a first semiconductor laser chip 11 in the form of a function block, which emits an infrared laser beam, for example. Inserted in the second recessed portion 10b is the lower portion of a second semiconductor laser chip 12 in the form of a function block, which emits a red laser beam, for example.

In this embodiment, the semiconductor laser chips 11 and 12 each have a thickness (height) of about 120 μm, while the recessed portions 10a and 10b are about 30 μm in depth, about 800 μm in the longitudinal direction, and about 300 μm in the transverse direction. It should be noted that the depth of the recessed portions 10a and 10b may be about 10 μm to 30 μm.

The material forming the substrate 10 is not limited to silicon, but the substrate 10 may be made of gallium arsenide (GaAs) or silicon carbide (SiC), for example, and is preferably made of material having excellent thermal conductivity. The material forming the substrate 10 may be selected in accordance with the type of function block and the application of the semiconductor laser device 100, for example.

The emission wavelengths of the first and second semiconductor laser chips 11 and 12 are not limited to the above-described combination. For example, any two laser beams may be selected from infrared, red, and blue laser beams. Moreover, a third recessed portion may be so formed in the substrate 10 as to be located alongside, e.g., the first recessed portion 10a, and three semiconductor laser chips that emit mutually different laser beams may be respectively disposed into those recessed portions. Furthermore, four or more recessed portions may be formed in the substrate 10, and semiconductor laser chips may be disposed into the respective recessed portions.

The semiconductor laser device 100 is applicable in an optical pickup system (not shown) for use in the reading or writing of data from or on an optical disc, for example. In the first embodiment, the semiconductor laser chips 11 and 12 are both so-called facet-emitting semiconductor laser chips in which a semiconductor layer facet emits a laser beam. As shown in FIGS. 1B and 1C, the semiconductor laser chips 11 and 12 are arranged so that laser beams emitted from their respective laser-emitting facets 11a and 12a enter an objective lens incorporated in the optical pickup system. Therefore, the laser-emitting facets 11a and 12a of the semiconductor laser chips 11 and 12 are located in alignment with each other, and the heights of their laser-emitting portions 11c and 12c are made equal to each other, for example.

Further, the semiconductor laser device 100 is structured so that the respective laser-emitting positions (active layers) of the semiconductor laser chips 11 and 12 are embedded in the recessed portions 10a and 10b.

The first embodiment is therefore characterized in that as shown in FIG. 1B, first and second notches 10c and 10d are formed in the substrate 10 in such a manner that the respective laser-emitting portions (resonator facets) 11c and 12c of the laser-emitting facets of the first and second semiconductor laser chips 11 and 12 are exposed through the first and second notches 10c and 10d. In this embodiment, the lower ends of the notches 10c and 10d preferably reach the bottoms of the recessed portions 10a and 10b, respectively. Then, in the case of forming the recessed portions 10a and 10b in the substrate 10 by etching, the etching depth for the recessed portions 10a and 10b and the notches 10c and 10d will be the same, which facilitates control of the etching.

In this manner, the presence of the notches 10c and 10d in the substrate 10 allows the semiconductor laser chips 11 and 12 to emit a laser beam as shown in FIG. 1C, even if the semiconductor laser chips 11 and 12 are so structured as to be fitted into the recessed portions 10a and 10b in the substrate 10. In this embodiment, the distance between the first and second notches 10c and 10d (i.e., the distance between the laser emission points) is about 11 μm.

Further, third and fourth notches 10e and 10f are also formed in the substrate 10 so that laser beams emitted from the rear facets 11b and 12b of the semiconductor laser chips 11 and 12 are obtained for a power monitor through the third and fourth notches 10e and 10f. The rear facets 11b and 12b are located opposite to the laser-emitting facets 11a and 12a, respectively. The third and fourth notches 10e and 10f for the power monitor are not necessarily needed, and whether they should be formed or not may be determined depending upon the application of the semiconductor laser device 100.

The respective plan configurations of the first and second semiconductor laser chips 11 and 12 are not limited to a rectangle, but may be varied depending upon the application and function. Specifically, the plan configuration of each function block may be a square or a circle; or a shape having 2-fold rotational symmetry such as a parallelogram, an ellipse, or an oval; or a shape having 1-fold rotational symmetry such as a trapezoid. It should be however noted that in the case of a square or a circle, it becomes slightly difficult to align the respective emission directions of the function blocks.

In the first embodiment, since the laser-emitting portions 11c and 12c are formed in the light-emitting facets so as to be located away from the respective centers of the light-emitting facets, a shape having 1-fold rotational symmetry is preferable if mounting is performed in a self-aligned manner by the FSA technology.

As described above, in the first embodiment, the semiconductor laser chips 11 and 12, which differ from each other in emission wavelength and have been formed into the function blocks, are arranged so that the respective laser-emitting directions are parallel with each other. This enables the laser-emitting portions 11c and 12c of the semiconductor laser chips 11 and 12 to self-align, such that wavefront aberration created in the optical system for the laser beams can be reliably reduced.

In addition, the depth dimension of the recessed portions 10a and 10b, which are formed in the substrate 10 and into which the first and second semiconductor laser chips 11 and 12 are to be mounted, is made smaller than the height of the semiconductor laser chips 11 and 12. This facilitates the process step of forming the recessed portions 10a and 10b as compared with the case in which the semiconductor laser chips 11 and 12 are inserted entirely into the recessed portions 10a and 10b. Accordingly, productivity in fabricating the semiconductor light emitters with an array structure can be increased significantly.

It should be noted that the first and second semiconductor laser chips 11 and 12 may be so structured as to have the same emission wavelength and different optical output values.

Also, the first and second semiconductor laser chips 11 and 12 may be established in such a manner that optical output from the laser-emitting facet 11a is equivalent in value to optical output from the rear facet 11b, and that optical output from the laser-emitting facet 12a is equivalent in value to optical output from the rear facet 12b.

Furthermore, the locations of the semiconductor laser chips 11 and 12 in the form of the function bocks are not limited to this embodiment, but may be opposite to each other.

Recess Electrode

In the case where the semiconductor laser device 100 has the structure in which both p-side and n-side electrodes serving as chip electrodes for the first and second semiconductor laser chips 11 and 12 are formed at the principal surface side of the substrate 10, electrodes (recess electrodes) do not have to be formed on the respective bottom faces of the recessed portions 10a and 10b.

However, recess electrodes have to be formed on the bottom faces of the recessed portions 10a and 10b when chip electrodes, i.e., a p-side electrode and an n-side electrode, are respectively formed on the upper and lower faces of each of the semiconductor laser chips 11 and 12 in such a manner that the chip electrodes face each other.

Figure 2A:
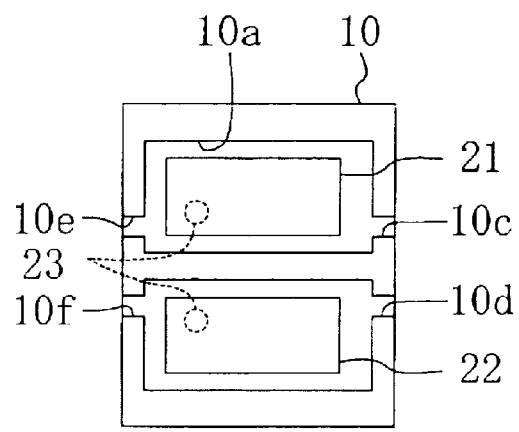
FIGS. 2A through 2C are plan views schematically illustrating recessed portions and recess electrodes formed in respective substrates of semiconductor laser devices in accordance with the first embodiment of the present invention.
Figure 2B:
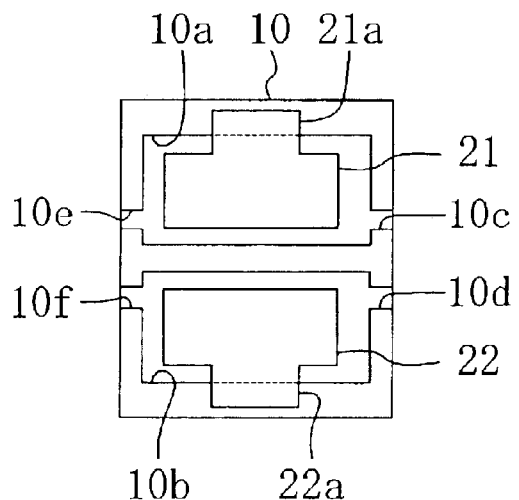
Figure 2C:
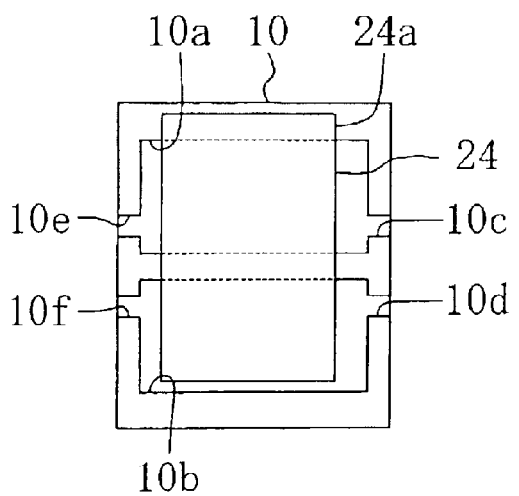

FIGS. 2A through 2C illustrate the respective plan configurations of recess electrodes formed in three different ways.

FIG. 2A illustrates recess electrodes according to a first example. As shown in FIG. 2A, in order to drive the first and second semiconductor laser chips 11 and 12, first and second recess electrodes 21 and 22 made of low-melting-point metal, such as solder material, are respectively formed on the bottom faces of the recessed portions 10a and 10b in the substrate 10.

After the semiconductor laser chips 11 and 12 in the form of the function blocks have been respectively disposed into the recessed portions 10a and 10b in the substrate 10 by a FSA technique, which will be described later, the first and second recess electrodes 21 and 22 are heated to a degree at which the solder material melts. In this manner, the chip electrodes of the semiconductor laser chips 11 and 12 can be electrically connected to the recess electrodes 21 and 22, respectively.

Further, the first and second recess electrodes 21 and 22 can be electrically connected to the outside of the substrate 10 through vias 23, which may be formed by, for example, forming through-holes (via holes) in the substrate 10 under the recess electrodes and then filling the through-holes with conductive material.

FIG. 2B illustrates recess electrodes according to a second example. As shown in FIG. 2B, extended portions 21a and 22a are respectively formed on the outer sides of first and second recess electrodes 21 and 22 which are in parallel with the emission directions. The extended portions 21a and 22a extend from the bottom faces of the recessed portions 10a and 10b in the substrate 10 beyond the principal surface of the substrate 10. In this manner, since the recess electrodes 21 and 22 have the extended portions 21a and 22a, respectively, electrical connection for the chip electrodes formed on the respective bottom faces of the semiconductor laser chips 11 and 12 can be established from the principal surface side of the substrate 10 without forming vias 23 in the lower portion of the substrate 10.

Further, FIG. 2C illustrates recess electrodes according to a third example. As shown in FIG. 2C, a common recess electrode 24 is formed on the bottom faces of the first and second recessed portions 10a and 10b so that the common recess electrode 24 extends across the boundary between the bottom faces. Also in this example, an extended portion 24a is formed on the outer side of a first recess electrode 21 which is in parallel with the emission direction, in such a manner that the extended portion 24a extends from the bottom face of the first recessed portion 10a beyond the principal surface of the substrate 10.

Therefore, with the common recess electrode 24 that extends across the boundary between the first and second recessed portions 10a and 10b, even if the first and second semiconductor laser chips 11 and 12 have different laser-emission wavelengths, the semiconductor laser chips, which forms a laser chip array, are allowed to have a common chip electrode on their bottom faces.

In forming the common recess electrode 24, if the boundary portion between the first and second recessed portions 10a and 10b in the substrate 10 is removed so that the boundary portion has substantially the same height as the bottom faces of the recessed portions 10a and 10b, then, it becomes easier to form the common recess electrode 24.

The foregoing has described how to make conductive the bottom-face electrodes of the chip electrodes formed on the first and second semiconductor laser chips 11 and 12. For the upper-face chip electrodes that are exposed at the principal surface side of the substrate 10, interconnection can be relatively easily established by wire bonding.

(Second Embodiment)

Hereinafter, a second embodiment of the present invention will be described with reference to the accompanying drawings.

Figure 3A:
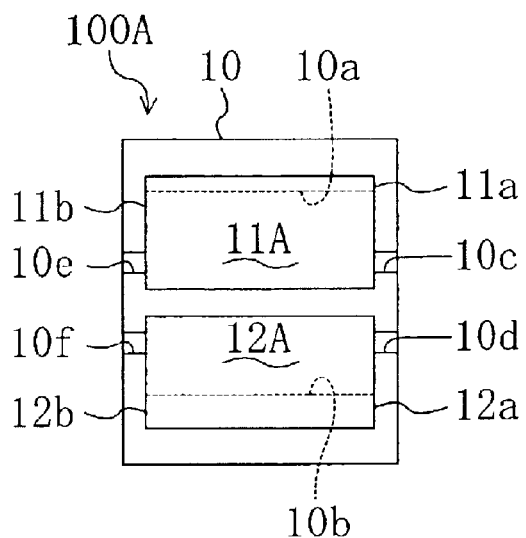
FIGS. 3A through 3C schematically illustrate a semiconductor laser device in accordance with a second embodiment of the present invention.
Figure 3B:
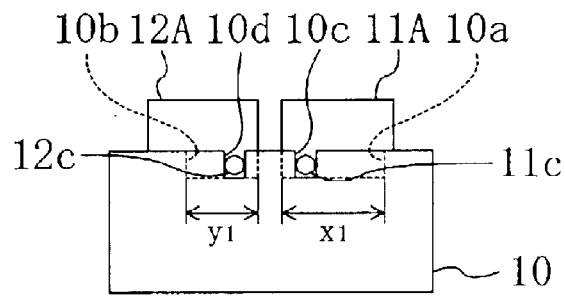
Figure 3C:
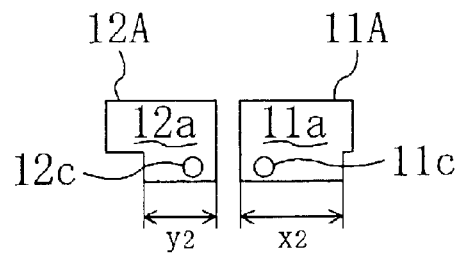

FIGS. 3A through 3C illustrate a semiconductor laser device in accordance with a second embodiment of the present invention. FIG. 3A shows a plan configuration, FIG. 3B shows a front configuration, and FIG. 3C shows the front configuration of semiconductor laser chips which form a chip array. In FIGS. 3A and 3B, the same members as those shown in FIGS. 1A and 1B are identified by the same reference numerals and the descriptions thereof will be omitted herein.

As shown in FIGS. 3A and 3B, in a semiconductor laser device 100A according to the second embodiment, the width dimensions of first and second recessed portions 10a and 10b formed in a substrate 10 are made smaller than the width dimensions of the respective portions of first and second semiconductor laser chips 11A and 12A which are not inserted into the recessed portions 10a and 10b. In addition, as shown in FIG. 3B, the width dimension $y_1$ of the second recessed portion 10b is made smaller than the width dimension $x_1$ of the first recessed portion 10a. As shown in FIG. 3C, therefore, the sections of the first and second semiconductor laser chips 11A and 12A which are in parallel with their laser-emitting facets 11a and 12a, respectively, have a downwardly extended shape. Further, the second semiconductor laser chip 12A is formed so that the width dimension $y_2$ of its portion that is set into the second recessed portion 10b becomes smaller than the width dimension $x_2$ of a portion of the first semiconductor laser chip 11A which is inserted into the first recessed portion 10a.

Accordingly, in the second embodiment, the first and second semiconductor laser chips 11A and 12A are formed so that their portions that are inserted into the recessed portions 10a and 10b have different shapes from the portions thereof that are not inserted. This prevents the first and second semiconductor laser chips 11A and 12A from being disposed upside down into the recessed portions 10a and 10b.

Moreover, as shown in FIG. 3B, the width dimension $x_1$ of the first recessed portion 10a differs in value from the width dimension $y_1$ of the second recessed portion 10b. Thus, even if a FSA technique is used, the first and second semiconductor laser chips 11A and 12A are prevented from being disposed in the recessed portions 10a and 10b in opposite relation to each other.

This makes it possible to reliably and easily perform the process step of selectively disposing the semiconductor laser chips 11A and 12A, which differ from each other in laser-emitting wavelength or optical output value, into the corresponding recessed portions 10a and 10b.

Also, the laser-emitting facets 11a and 12a of the semiconductor laser chips 11A and 12A are located in alignment with each other, and the heights of their laser-emitting portions 11c and 12c are made equal to each other.

(Modified Example of the Second Embodiment)

Hereinafter, a modified example of the second embodiment of the present invention will be described with reference to the accompanying drawings.

Figure 4:
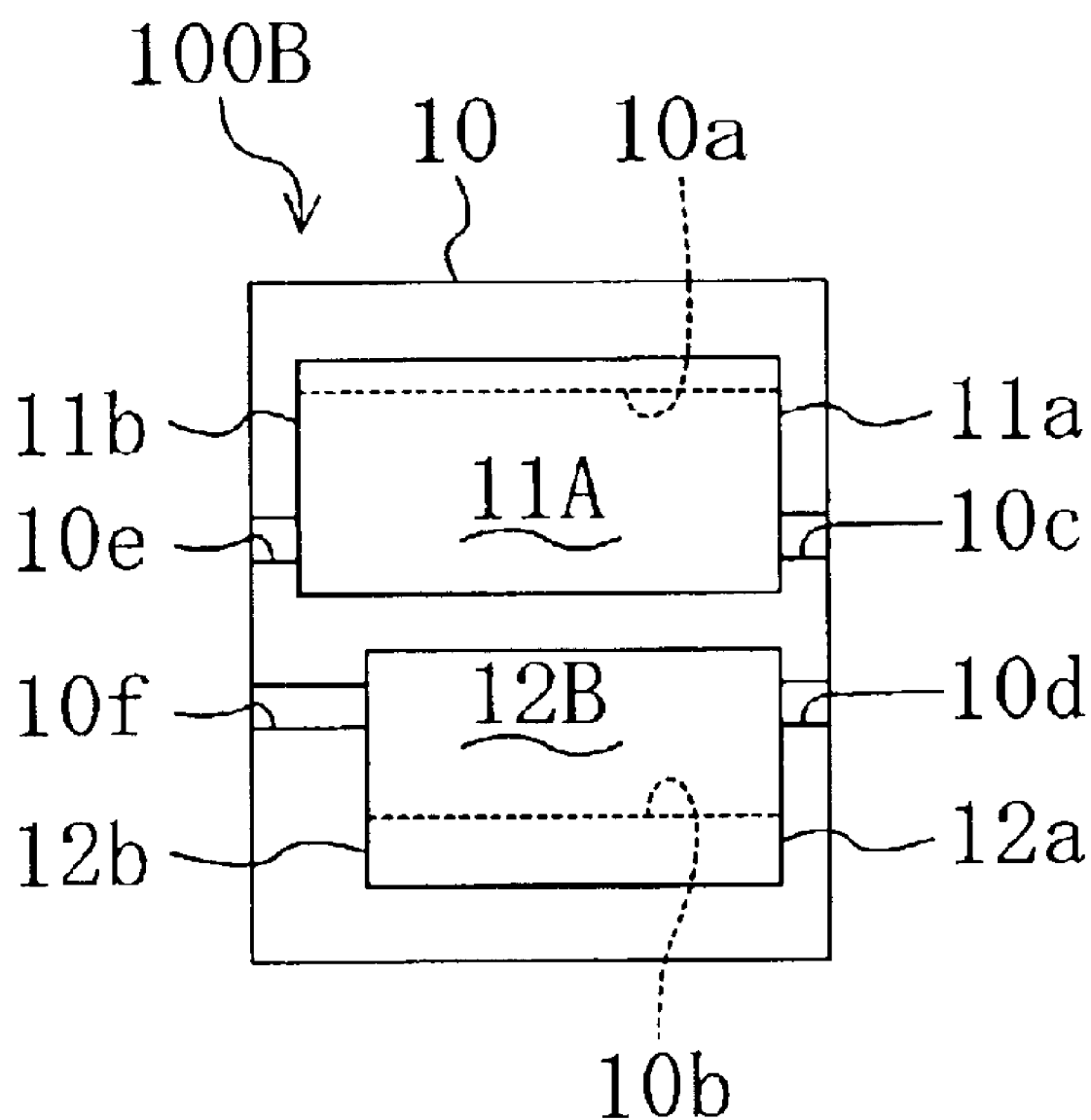
FIG. 4 is a plan view schematically illustrating a semiconductor laser device in accordance with a modified example of the second embodiment of the present invention.

FIG. 4 illustrates the plan configuration of a semiconductor laser device in accordance with a modified example of the second embodiment of the present invention. In FIG. 4, the same members as those shown in FIG. 3A are identified by the same reference numerals.

As shown in FIG. 4, in a semiconductor laser device 100B according to this modified example, the length dimension of a second semiconductor laser chip 12B, which is the dimension in a direction parallel to its emission direction, is made smaller than the length dimension of a first semiconductor laser chip 11A.

In addition, a second recessed portion 10b has a smaller width dimension than a first recessed portion 10a.

As shown in the figure, also in this modified example, the respective portions of the first and second semiconductor laser chips 11A and 12B which are inserted in the recessed portions 10a and 10b have different shapes from the portions thereof that are not inserted. In addition, the shapes (sizes) of the recessed portions 10a and 10b are different from each other. This therefore facilitates the process of disposing into given locations the semiconductor laser chips 11A and 12B that have mutually different laser-emitting wavelengths or mutually different optical output values.

(Third Embodiment)

Hereinafter, a third embodiment of the present invention will be described with reference to the accompanying drawings.

Figure 5:
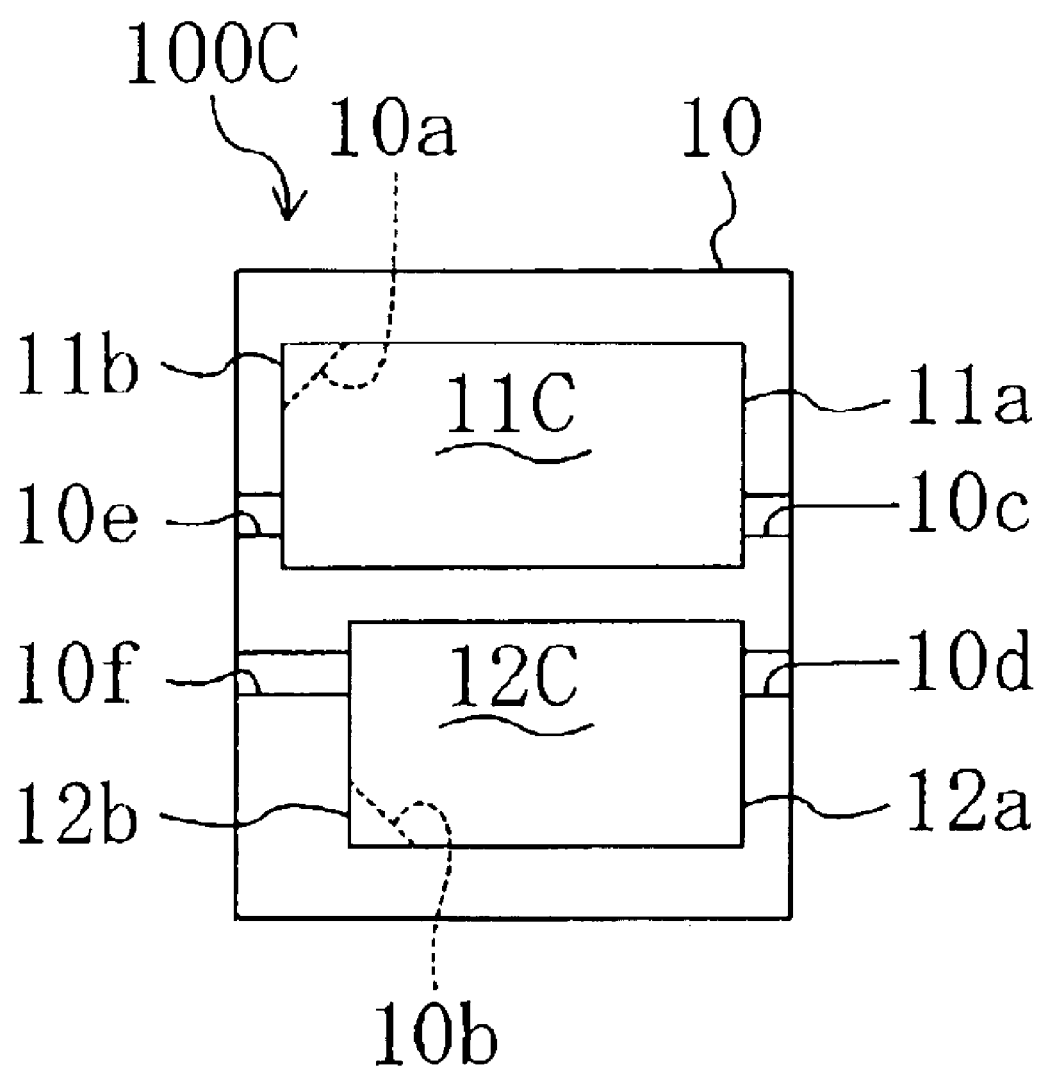
FIG. 5 is a plan view schematically illustrating a semiconductor laser device in accordance with a third embodiment of the present invention.

FIG. 5 illustrates the plan configuration of a semiconductor laser device in accordance with a third embodiment of the present invention. In FIG. 5, the same members as those shown in FIG. 1A are identified by the same reference numerals.

In a semiconductor laser device 100C in accordance with the third embodiment, the respective plan configurations of first and second recessed portions 10a and 10b formed in a substrate 10 are made pentagonal by an etching process performed in such a manner that an outer corner of each rectangle is left. Accordingly, the plan configurations of the first and second recessed portions 10a and 10b have 1-fold rotational symmetry instead of 2-fold rotational symmetry. Additionally, first and second semiconductor laser chips 11C and 12C are formed so that the plan configurations of their respective portions that are not inserted in the recessed portions 10a and 10b are kept rectangular so as to differ from the plan configurations of their inserted portions.

Moreover, as in the first modified example of the second embodiment, the second semiconductor laser chip 12C has a smaller length dimension than the first semiconductor laser chip 11C.

In a typical high-output laser chip, a laser output value (power) on its laser-emitting facet side greatly differs from a laser output value on the rear facet side thereof. The laser-emitting facet and the rear facet thus have to be positively distinguished from each other.

In the third embodiment, therefore, the first and second semiconductor laser chips 11C and 12C are formed so that the plan configurations of their portions that are inserted into the respective recessed portions 10a and 10b lose point symmetry, and at the same time the shapes (sizes) of the recessed portions 10a and 10b are made different from each other. In this manner, a set of the first semiconductor laser chips 11C are mounted (disposed) onto locations that are uniquely determined therefor, and so are a set of the second semiconductor laser chips 12C.

(Modified Examples of the Third Embodiment)

Hereinafter, various modified examples of the third embodiment of the present invention will be described with reference to the accompanying drawings.

Figure 6A:
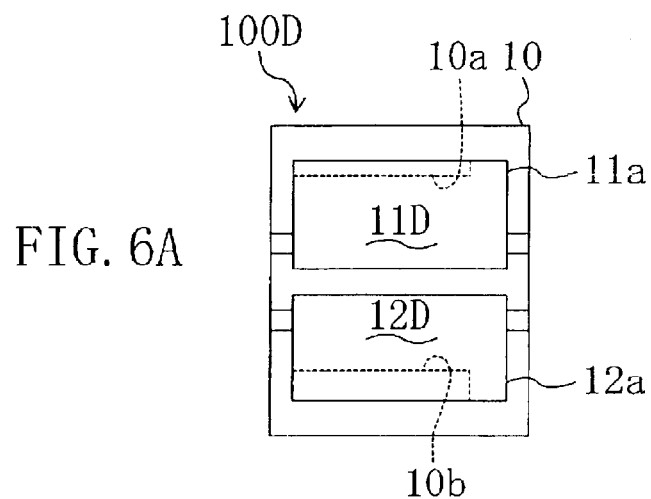
FIGS. 6A through 6C schematically illustrate semiconductor laser devices in accordance with modified examples of the third embodiment of the present invention.
Figure 6B:
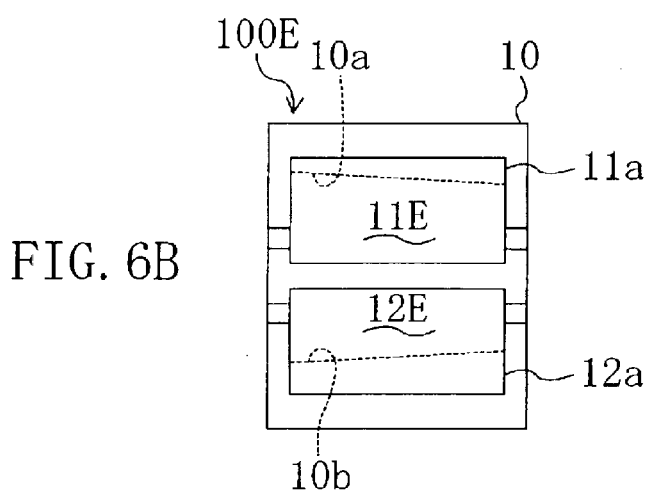
Figure 6C:
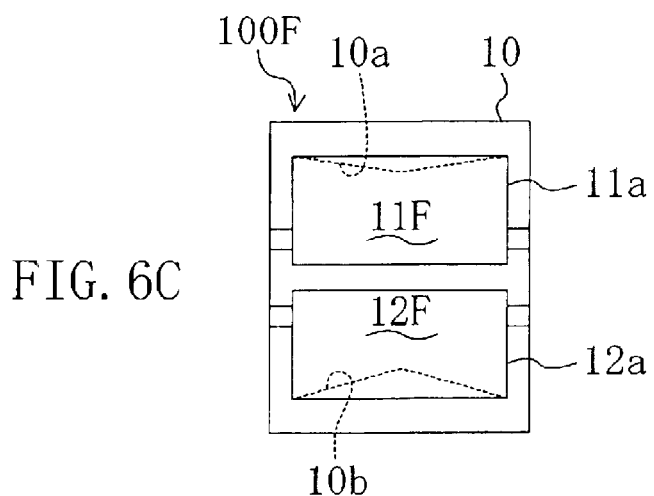

FIGS. 6A through 6C illustrate semiconductor laser devices in accordance with modified examples of the third embodiment of the present invention. FIG. 6A shows the plan configuration of a semiconductor laser device according to a first modified example, FIG. 6B shows the plan configuration of a semiconductor laser device according to a second modified example, and FIG. 6C shows the plan configuration of a semiconductor laser device according to a third modified example.

A semiconductor laser device 100D according to the first modified example shown in FIG. 6A is formed so that the respective plan configurations of first and second recessed portions 10a and 10b formed in a substrate 10 are made to be a concave pentagon by an etching process performed in such a manner that part of the outer side (longitudinal side) portion of each rectangle which includes an outer corner of each such rectangle is left; therefore the plan configurations of the first and second recessed portions 10a and 10b do not have 2-fold rotational symmetry. Further, the respective plan configurations of the recessed portions 10a and 10b are made different from each other. Therefore, a set of semiconductor laser chips 11D are mounted (disposed) onto locations that are uniquely determined therefor, and so are a set of semiconductor laser chips 12D.

A semiconductor laser device 100E according to the second modified example shown in FIG. 6B is formed so that the respective plan configurations of first and second recessed portions 10a and 10b formed in a substrate 10 are made trapezoidal by an etching process performed in such a manner that the outer side (longitudinal side) portion of each rectangle is left to be slanting; therefore the respective plan configurations of the first and second recessed portions 10a and 10b do not have 2-fold rotational symmetry. In addition, the respective plan configurations of the recessed portions 10a and 10b are made different from each other. Thus, a set of semiconductor laser chips 11E are mounted (disposed) onto locations that are uniquely determined therefor, and so are a set of semiconductor laser chips 12E.

In a semiconductor laser device 100F according to the third modified example shown in FIG. 6C, the respective plan configurations of first and second recessed portions 10a and 10b formed in a substrate 10 are made to be a concave pentagon by making the center of the outer side (longitudinal side) of each rectangle protruded inwardly, such that the plan configurations of the first and second recessed portions 10a and 10b do not have 2-fold rotational symmetry. In addition, the respective plan configurations of the recessed portions 10a and 10b are made different from each other. Also in this modified example, a set of semiconductor laser chips 11F are mounted (disposed) onto locations that are uniquely determined therefor, and so are a set of semiconductor laser chips 12F.

(Method for Fabricating a Semiconductor Laser Device)

Hereinafter, it will be described how to fabricate a semiconductor laser device according to the third embodiment of the present invention with reference to the accompanying drawings.

Semiconductor laser chips in the form of function blocks can be disposed into recessed portions formed in a substrate, manually or by assembly equipment, for example. However, it is among the objects of the present invention to significantly increase the efficiency of the process of disposing (mounting) a plurality of semiconductor laser chips by using the above-mentioned FSA technology. Hereinafter, fabrication of a semiconductor laser device 100E in accordance with the second modified example of the third embodiment will be described as an example.

First, a method for forming the inventive recessed portions on the principal surface of a substrate will be described.

Figure 7A:
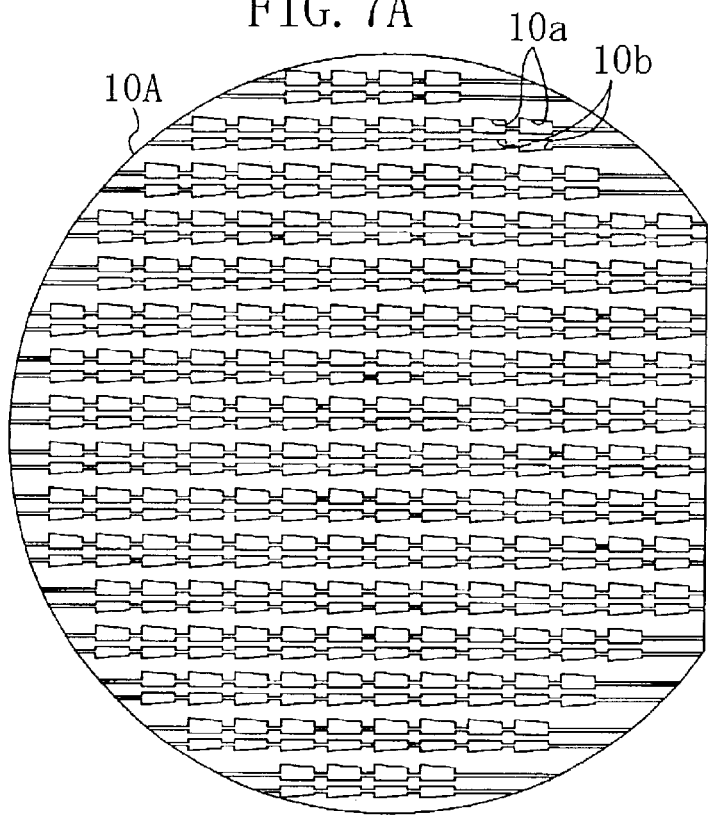
FIGS. 7A and 7B illustrate a substrate, being in a wafer state, of semiconductor laser devices according to the second modified example of the third embodiment of the present invention.
Figure 7B:
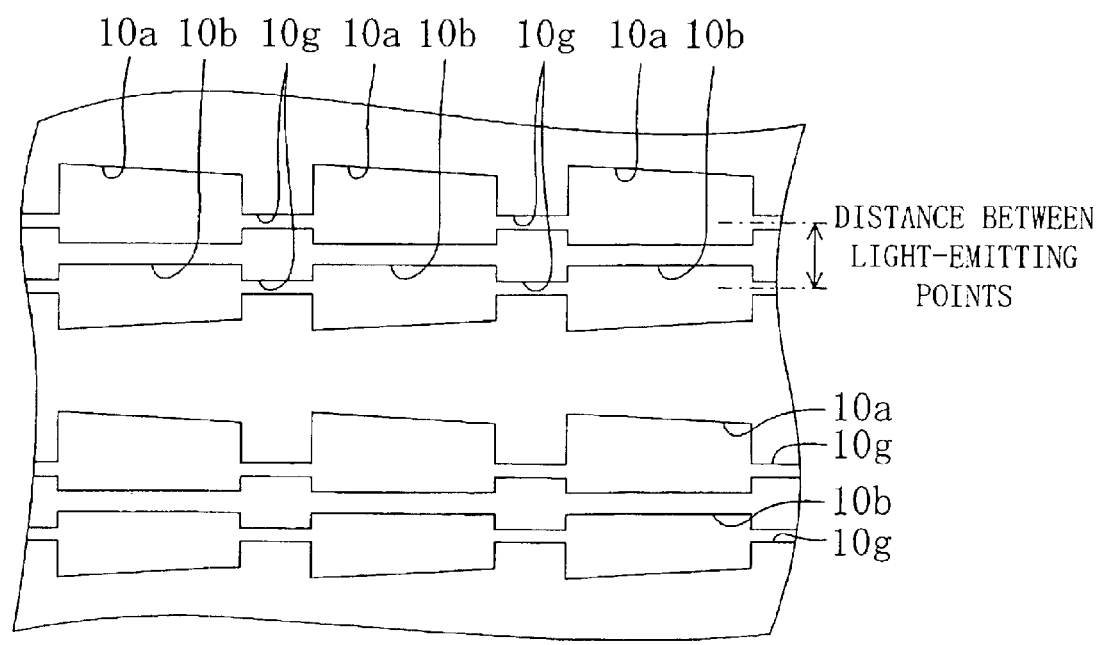

FIGS. 7A and 7B illustrate a wafer 10A, which will serve as a substrate for semiconductor laser devices according to the second modified example of the third embodiment of the present invention, which is made of silicon, gallium arsenide, or silicon carbide, and in which a plurality of recessed portions have been formed. FIG. 7A illustrates the plan configuration of the wafer 10A, and FIG. 7B is a view showing on an enlarged scale a part of the wafer 10A shown in FIG. 7A.

As shown in the enlarged partial view in FIG. 7B, a plurality of the first recessed portions 10a and a plurality of the second recessed portions 10b, which are adjacent to the first recessed portions 10a, are arranged in the principal surface of the wafer 10A as first and second recess rows, respectively, in such a manner as to be located in parallel with each other at a distance from each other in the longitudinal directions (laser-emitting directions) of the recesses. Semiconductor laser chips in the form of function blocks will be disposed into the first and second recessed portions 10a and 10b.

In the principal surface of the wafer 10A, a groove 10g is formed in the region between any two of the first recessed portions 10a which are adjacent to each other in the longitudinal direction as well as in the region between any two of the second recessed portions 10b which are adjacent to each other in the longitudinal direction. The grooves 10g will act as notches through which emitted light is obtained after the wafer 10A is divided.

Method for Forming a Substrate

An exemplary method for forming a substrate will be described.

FIGS. 8A through 8E are cross-sectional views illustrating process steps for forming recessed portions in a substrate of a semiconductor laser device in accordance with the second modified example of the third embodiment of the present invention. Herein, a wafer 10A made of silicon is used, and by focusing attention only on a first recessed portion 10a formed in part of the wafer 10A, the figures illustrate such part of the wafer 10A in cross section taken in the vertical direction with respect to the emission direction.

Figure 8A:
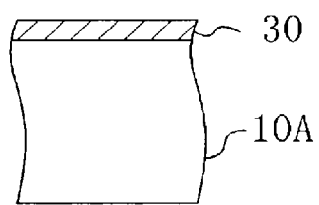
FIGS. 8A through 8E are cross-sectional views illustrating process steps for forming a substrate in a semiconductor laser device in accordance with the second modified example of the third embodiment of the present invention.

As shown in FIG. 8A, a mask film 30 of silicon dioxide (SiO$_2$) is deposited to a thickness of about 0.7 µm to 1 µm on the principal surface of the wafer 10A by a CVD process, for example.

Figure 8B:
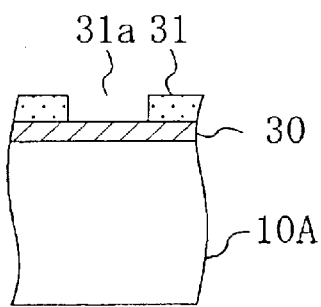

Next, as shown in FIG. 8B, a resist pattern 31 is selectively formed by lithography. The resist pattern 31 has an opening pattern 31a for the first recessed portions 10a and an opening pattern (not shown) for grooves 10g which will serve as notches.

Figure 8C:
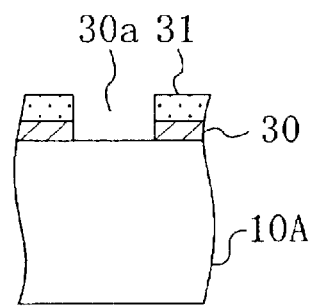

Then, as shown in FIG. 8C, with the resist pattern 31 acting as a mask, the mask film 30 is dry-etched using fluorocarbon, for example, as an etching gas, such that the opening pattern 30a for the first recessed portions 10a and the opening pattern (not shown) for the grooves 10g are transferred to the mask film 30.

Figure 8D:
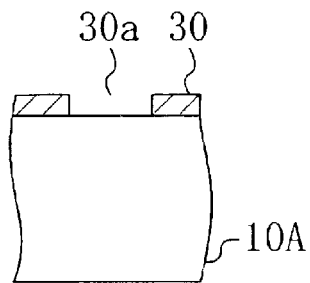
Figure 8E:
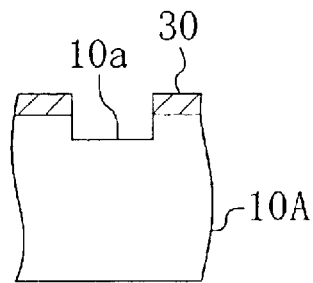

Subsequently, as shown in FIG. 8D, the resist pattern 31 is removed by ashing. Thereafter, as shown in FIG. 8E, with the mask film 30 having the opening pattern 30a acting as a mask, the wafer 10A is dry-etched using chlorine (Cl$_2$) or hydrogen bromide (HBr), for example, as an etching gas, so that the first recessed portions 10a with a depth of about 30 µm are formed in the wafer 10A. In this method, the type of etching performed for the wafer 10A is not limited to the dry etching, but the wafer 10A may be wet-etched using a mixed solution of hydrofluoric acid and nitric acid. Second recessed portions 10b and grooves connected thereto are formed in the same manner as, and at the same time with, the first recessed portions 10b and the grooves 10g connected thereto. The bottom face of each groove 10g reaches the bottom faces of the recessed portions 10a or 10b to which the groove 10g is connected. Then, the timing at which the etching is stopped will be the same for the recessed portions 10a and 10b and the grooves 10g. This facilitates control of the etching, and is thus preferable. Subsequently, the wafer 10A in which the recessed portions 10a have been formed is washed with water and then dried.

Thereafter, when recess electrodes are necessary, suitable electrodes are selected from electrodes such as shown in FIGS. 2A through 2C, and formed.

Method for Forming Semiconductor Laser Chips (Function Blocks)

Hereinafter, an exemplary method for forming semiconductor laser chips will be described.

FIGS. 9A through 9D are cross-sectional views illustrating process steps for forming a semiconductor laser chip in a semiconductor laser device in accordance with the second modified example of the third embodiment of the present invention.

Figure 9A:
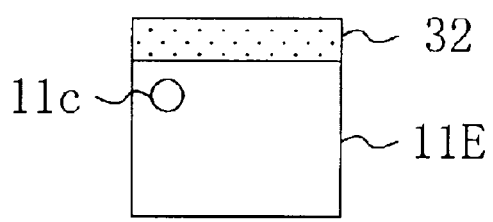
FIGS. 9A through 9D are cross-sectional views illustrating process steps for forming a semiconductor laser chip in a semiconductor laser device in accordance with the second modified example of the third embodiment of the present invention.

First, as shown in FIG. 9A, a resist film 32 is formed by application on the whole surface of a first semiconductor laser chip 11E which is located closer to its laser-emitting portion 11c (active layer). Although not shown, the first semiconductor laser chip 11E is in a wafer state.

Figure 9B:
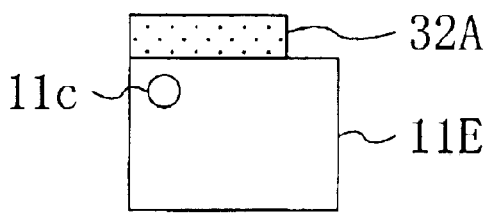

Next, as shown in FIG. 9B, a resist pattern 32A having a pattern for first recessed portions 10a is formed out of the resist film 32 by lithography.

Figure 9C:
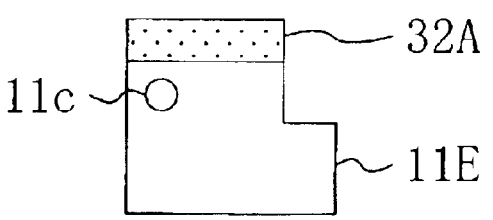

Then, as shown in FIG. 9C, with the resist pattern 32A acting as a mask, the first semiconductor laser chip 11E is dry-etched using silicon tetrachloride (SiCl$_4$) or sulfur hexafluoride (SF$_6$), for example, as an etching gas. In this manner, a portion of the first semiconductor laser chip 11E which is inserted in the first recessed portion 10a is formed.

Figure 9D:
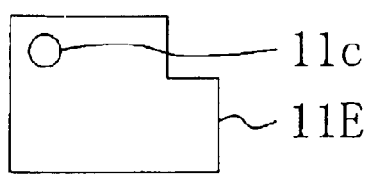

Then, as shown in FIG. 9D, the resist pattern 32A is removed. Subsequently, the first semiconductor laser chips 11E in a wafer state are washed with an organic solvent such as acetone, and then dried. Thereafter, the first semiconductor laser chips 11E in a wafer state are divided into chips.

Next, second semiconductor laser chips 12E are formed in the same manner as the first semiconductor laser chips 11E. In this process step, of course, the plan dimension of portions of the second semiconductor laser chips 12E which are inserted in second recessed portions 10b is made smaller as compared with the case of the first semiconductor laser chips 11E.

Needless to say, either the first or second semiconductor laser chips 11E or 12E may be formed first.

Method for Mounting Semiconductor Laser Chips

Next, it will be described how to mount semiconductor laser chips.

A method for mounting semiconductor laser chips in accordance with the third embodiment employs a FSA technique as a method for disposing the first and second semiconductor laser chips 11E and 12E in the form of the function blocks into the recessed portions 10a and 10b formed in the wafer 10A. The FSA technique of this embodiment enables the first and second semiconductor laser chips 11E and 12E in the form of the function blocks to be disposed in the desired locations precisely and highly efficiently.

In the FSA technology, function blocks are spread into a fluid (medium) such as water ($H_2O$) or methyl alcohol ($CH_3OH$). In the case of assembling two-wavelength laser chip arrays, therefore, function blocks preferably have different plan configurations like the first and second semiconductor laser chips 11E and 12E. Specifically, it is preferable to form in the wafer 10A recessed portions 10a and 10b in which the first and second semiconductor laser chips 11C through 11F and 12C through 12F according to the third embodiment and the modified examples thereof shown, e.g., in FIG. 4 can be disposed.

In mounting the semiconductor laser chips 11C and 12C of the third embodiment, it is desirable that the laser chips having a larger plan dimension, that is, the first semiconductor laser chips 11C are disposed first. If the second semiconductor laser chips 12C whose plan dimension is smaller are disposed first, the second semiconductor laser chips 12C would be disposed into the first recessed portion 10a as well, which have a larger plan dimension than the second semiconductor laser chips 12C.

First, when recess electrodes have been formed on the bottom faces of the first and second recessed portions 10a and 10b, solder material is applied onto the recess electrodes. In the case where the recess electrodes are not formed, a thermosetting adhesive or a UV-setting adhesive, for example, may be applied.

Now, equipment for mounting function blocks onto a substrate using an FSA technique will be briefly described.

Figure 10:
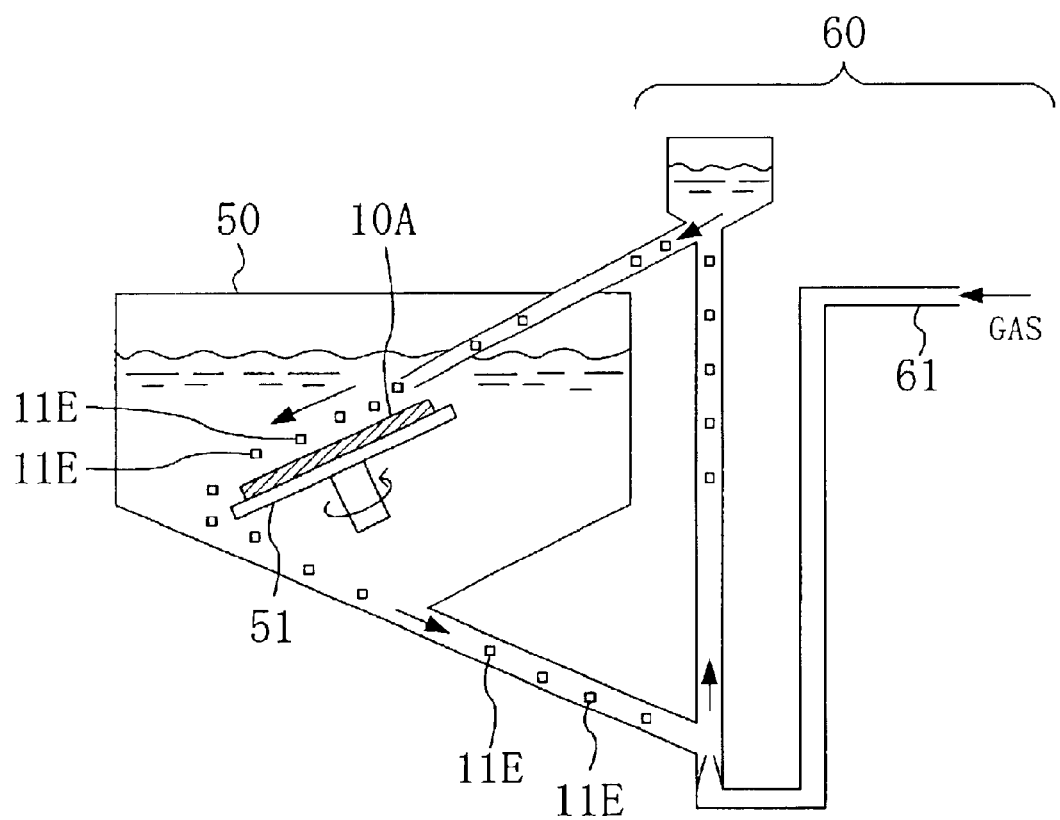
FIG. 10 schematically shows equipment for mounting (disposing) semiconductor laser chips for use in the manufacturing of semiconductor laser devices in accordance with the second modified example of the third embodiment of the present invention.

FIG. 10 schematically shows equipment for mounting a plurality of semiconductor laser chips 11E and 12E that have been formed into function blocks.

As shown in FIG. 10, the equipment in accordance with the third embodiment includes a receptacle 50, a wafer holder 51, and a pump 60. The receptacle 50 is used to contain a fluid in the form of slurry in which a plurality of semiconductor laser chips in the form of function blocks have been spread. The wafer holder 51 provided on the bottom of the receptacle 50 is capable of rotating and used to hold a wafer 10A on its upper face. The pump 60 circulates the fluid in the form of slurry. The upper face of the wafer holder 51 is located slantingly with respect to the surface of the fluid.

The pump 60 is provided so that the fluid in the form of slurry is circulated inside the receptacle 50 by introduction of a nitrogen gas, for example, from a gas inlet portion 61, and that the circulated fluid is poured over the upper face of the wafer holder 51.

Subsequently, a wafer 10A, in which a plurality of first and second recessed portions 10a and 10b and grooves 10g have been formed, is held on the wafer holder 51.

Thereafter, with the wafer holder 51 being rotated in its wafer-holding plane, a fluid in the form of slurry, in which a plurality of semiconductor laser chips 11E have been spread, is poured over the principal surface of the wafer 10A that is held on the upper face of the wafer holder 51 in a slanting position. In this manner, the first semiconductor laser chips 11E are disposed into the respective first recessed portions 10a formed in the wafer 10A. Since the fluid in the form of slurry is circulated by the pump 60, the first semiconductor laser chips 11E which are not disposed into the first recessed portions 10a can be collected and reused any number of times.

In the third embodiment, since the wafer 10A held in the fluid is rotated in its principal surface, even if the first semiconductor laser chips 11E have been structured in such a manner that only a portion of each first semiconductor laser chip 11E is inserted in the first recessed portion 10a, the first semiconductor laser chips 11E can be mounted reliably. The reasons for this will be described with reference to FIGS. 11A and 11B.

Figure 11A:
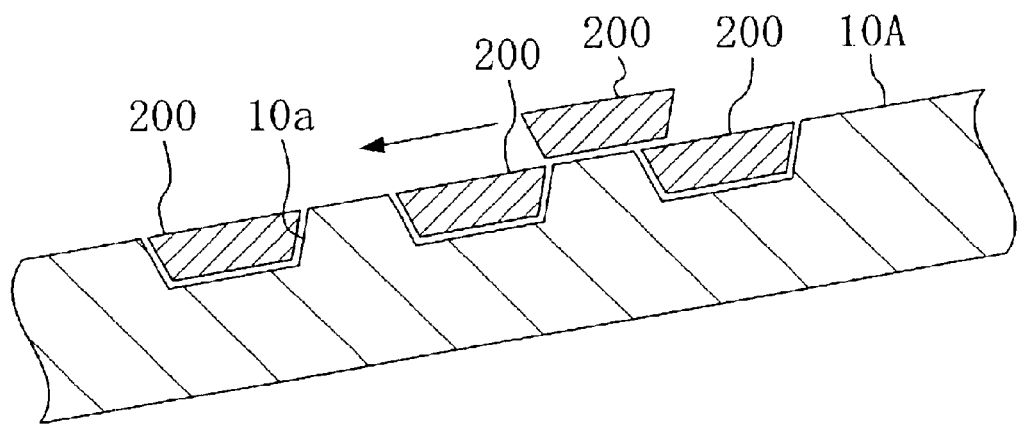
FIG. 11A is a schematic cross-sectional view illustrating how to dispose function blocks by the conventional FSA technique.

In the conventional FSA technology, as shown in FIG. 11A, function blocks 200 are inserted entirely into recessed portions 10a formed in a wafer 10A. Thus, the function blocks 200 that have been once disposed in the recessed portions 10a do not obstruct the flow of the other function blocks 200.

Figure 11B:
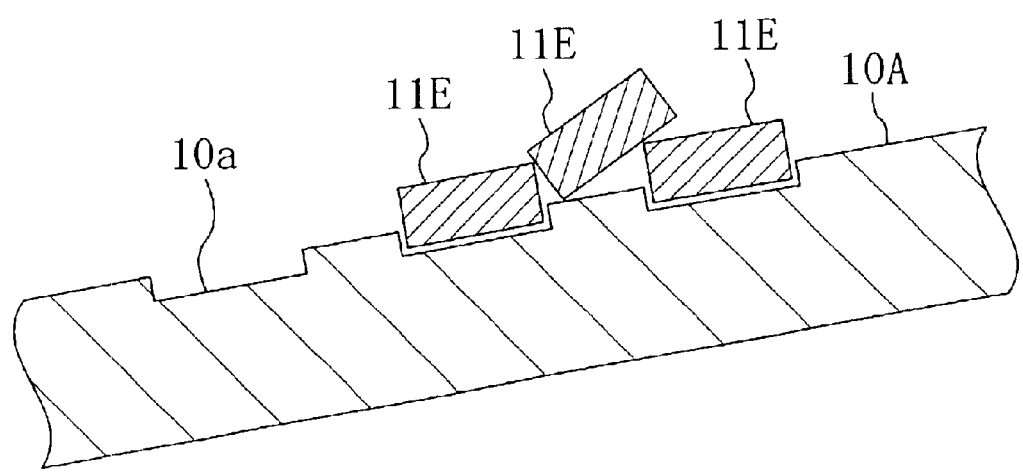
FIG. 11B is a schematic cross-sectional view illustrating how semiconductor laser chips are disposed by a FSA technique in a method for fabricating semiconductor laser devices in accordance with the second modified example of the third embodiment of the present invention.

However, as shown in FIG. 11B, in the present invention, only a portion of each first semiconductor laser chip 11E, for example, is inserted in the recessed portion 10a formed in the wafer 10A. Due to this, the semiconductor laser chips 11E that have been disposed in the recessed portions 10a each have a portion protruding from the surface of the wafer 10A, and such protruding portions would be in the way of the other semiconductor laser chips 11E flowing on the surface of the wafer 10A, resulting in decreased throughput (efficiency) of the mounting. Therefore, in the third embodiment, the wafer 10A is rotated in the fluid as shown in FIG. 10. The rotation of the wafer 10A changes the locations of the semiconductor laser chips 11E that have been disposed in the recessed portions 10a with respect to the direction of the flowing fluid, such that the flow of the other semiconductor laser chips 11E on the wafer 10A surface is not obstructed by the protruding portions of the already disposed semiconductor laser chips 11E.

Then, after it is confirmed that the mounting of the first semiconductor laser chips 11E into the first recessed portions 10a of the wafer 10A has been completed, a fluid in the form of slurry, in which a plurality of second semiconductor laser chips 12E in the form of function blocks have been spread, is used this time so that the second semiconductor laser chips 12E are disposed in second recessed portions 10b formed in the wafer 10A.

Figure 12:
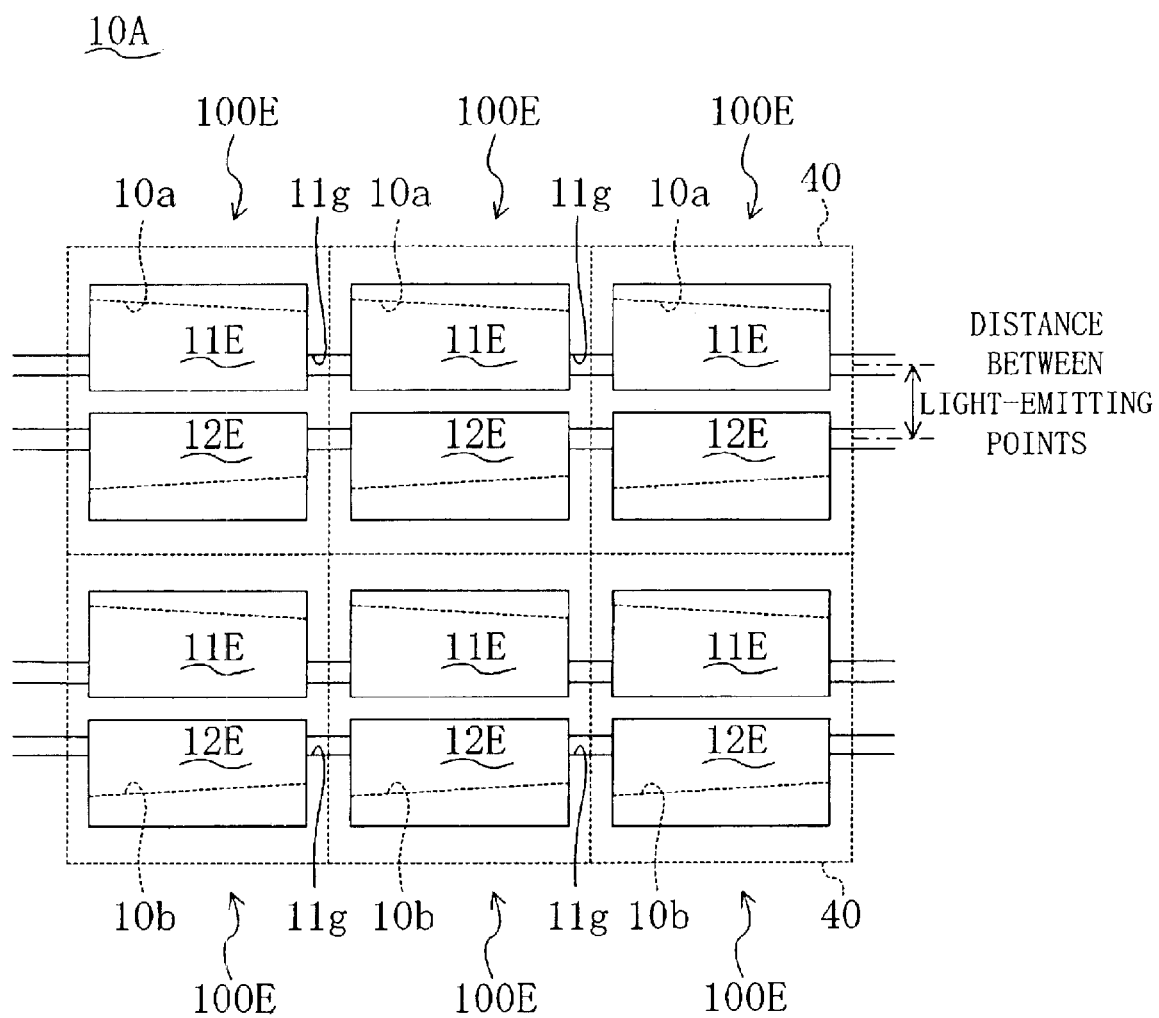
FIG. 12 is a partial enlarged plan view showing a substrate in a wafer state in which semiconductor laser chips have been disposed in the method for fabricating semiconductor laser devices in accordance with the second modified example of the third embodiment of the present invention.

FIG. 12 shows on an enlarged scale a part: of the wafer 10A in which the first and second semiconductor laser chips 11E and 12E have been disposed in the recessed portions 10a and 10b, respectively.

Thereafter, the first and second semiconductor laser chips 11E and 12E are secured. When the first and second semiconductor laser chips 11E and 12E are secured by solder material or a thermosetting adhesive, for example, the wafer 10A is heated. Alternatively, when a UV-setting adhesive is used for the securing, the entire principal surface of the wafer 10A is irradiated with ultraviolet light.

Next, the wafer 10A is cut using a dicing saw, for example, along dicing lines 40 indicated by broken lines in FIG. 12, thereby cutting each semiconductor laser device 100E from the wafer 10A.

As described above, according to the semiconductor laser chip fabrication method of the third embodiment, the mounting process can be simplified significantly. In addition, since only the semiconductor laser chips that have been determined as being non-defective can be mounted, the cost of the semiconductor laser devices can be reduced.

Furthermore, the use of the FSA technology in the mounting of the semiconductor laser chips onto the wafer 10A permits the semiconductor laser chips to be positioned in a self-aligned manner, which increases yields.

Moreover, the depth of the recessed portions 10a and 10b formed in the principal surface of the wafer 10A is made smaller than the thickness of the semiconductor laser chips 11E and 12E that are disposed in the recessed portions 10a and 10b. This facilitates the process of forming the recessed portions 10a and 10b in the wafer 10A, which results in increased throughput in the recess formation process step.

It should be noted that the present invention is not limited to semiconductor laser devices, but may be applicable to semiconductor devices in which light emitting diodes or other function elements are mounted on a substrate with respective portions of such diodes or elements inserted into recessed portions formed in the substrate.

What is claimed is:

1. A semiconductor device comprising:
a substrate having a plurality of recessed portions in its principal surface, and
a plurality of semiconductor chips each disposed in one of the recessed portions with a portion thereof inserted in that recessed portion,
wherein the depth dimension of the recessed portions is smaller than the height of the semiconductor chips that are disposed in the recessed portions,
each said semiconductor chip has a projection on the side thereof on which the semiconductor chip is inserted in one of the recessed portions.

2. A semiconductor device comprising:
a substrate having a plurality of recessed portions in its principal surface, and
a plurality of semiconductor chips each disposed in one of the recessed portions with a portion thereof inserted in that recessed portion,
wherein the depth dimension of the recessed portions is smaller than the height of the semiconductor chips that are disposed in the recessed portions,
the semiconductor chips are facet-emitting semiconductor laser chips that emit a laser beam from a facet,
the recessed portions in the substrate are formed so that the respective emission directions of the semiconductor laser chips are aligned in one direction, and
a notch, through which a laser-emitting portion of an associated one of the semiconductor laser chips is exposed, is formed in the substrate.

3. The device of claim 2, wherein two of the semiconductor laser chips have mutually different emission wavelengths.

4. The device of claim 2, wherein two of the semiconductor laser chips have mutually different optical output values.

5. The device of claim 2, wherein at least two said notches are formed.

6. The device of claim 2, wherein the notch has the shape of a depression and the lower end of the notch reaches the bottom face of an associated one of the recessed portions.

7. The device of claim 2, wherein in each said semiconductor laser chip, optical output from a front facet is equivalent in value to optical output from a rear facet.

8. A semiconductor device comprising:
a substrate having a plurality of recessed portions in its principal surface, and
a plurality of semiconductor chips each disposed in one of the recessed portions with a portion thereof inserted in that recessed portion,
wherein the depth dimension of the recessed portions is smaller than the height of the semiconductor chips that are disposed in the recessed portions, and
the portion of each said semiconductor chip that is inserted in one of the recessed portions differs in shape from the other portion thereof.

9. The device of claim 8, wherein each said semiconductor chip has a projection on the side thereof on which semiconductor chip is inserted in one of the recessed portions.

10. A semiconductor device comprising:
a substrate having a plurality of recessed portions in its principal surface, and
a plurality of semiconductor chips each disposed in one of the recessed portions with a portion thereof inserted in that recessed portion,
wherein the depth dimension of the recessed portions is smaller than the height of the semiconductor chips that are disposed in the recessed portions,
a recess electrode is formed on the bottom face of each said recessed portion in the substrate,
a chip electrode is formed on a face of each said semiconductor chip which faces the bottom face of the associated one of the recessed portions, and each said semiconductor chip is electrically connected to the associated recess electrode via the chip electrode, and
each said recess electrode is formed so that an edge portion thereof extends beyond the principal surface of the substrate.

11. The device of claim 10, wherein the recess electrode is so formed as to be used in common by the semiconductor chips.

12. A semiconductor device comprising:
a substrate having a plurality of recessed portions in its principal surface, and
a plurality of semiconductor chips each disposed in one of the recessed portions with a portion thereof inserted in that recessed portion,
wherein the depth dimension of the recessed portions is smaller than the height of the semiconductor chips that are disposed in the recessed portions,
the respective portions of the semiconductor chips which are inserted in the recessed portions differ from each other in shape, and
the shapes of the recessed portions vary according to the associated semiconductor chips.

13. The device of claim 12, wherein the semiconductor chips are light emitters, and the respective portions of the light emitters which are inserted in the recessed portions vary in shape in accordance with the emission wavelengths of the light emitters.

14. The device of claim 12, wherein the semiconductor chips are light emitters, and the respective portions of the light emitters which are inserted in the recessed portions vary in shape in accordance with the optical output values of the light emitters.

15. A method for fabricating a semiconductor device, comprising the steps of:
  (a) forming a plurality of recessed portions in the principal surface of a substrate, and
  (b) spreading a plurality of semiconductor elements in the form of chips in a liquid and pouring the semiconductor-element-spread liquid over the principal surface of the substrate with the substrate being rotated in the principal surface thereof, thereby allowing the semiconductor elements to be disposed into the respective recessed portions in a self-aligned manner.

16. The method of claim 15, wherein in the step (a), the depth dimension of the recessed portions is made smaller than the height of the semiconductor elements.

17. The method of claim 15, wherein the semiconductor elements are facet-emitting semiconductor laser chips that emit a laser beam from a facet, and in the step (a), the recessed portions are formed so that the respective emission directions of the semiconductor laser chips are aligned in one direction.

18. The method of claim 17, wherein the step (a) includes the step of forming in the substrate a notch through which a laser-emitting portion of an associated one of the semiconductor laser chips is exposed.

19. The method of claim 15, wherein in the step (a), the recessed portions are so formed as to vary in shape in accordance with the shapes of portions of the semiconductor elements which are inserted in the recessed portions.

20. The method of claim 19, further comprising, before the step (b), the step of forming the respective portions of the semiconductor elements which are inserted in the recessed portions, in the shape of a projection.

* * * * *